United States Patent
Shimura

(10) Patent No.: US 9,722,591 B2
(45) Date of Patent: Aug. 1, 2017

(54) PHASE ADJUSTMENT DEVICE, PHASE DIFFERENCE DETECTING DEVICE AND PHASE-ADJUSTING METHOD

(71) Applicant: FUJITSU LIMITED, Kawasaki-shi, Kanagawa (JP)

(72) Inventor: Toshihiro Shimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/808,881

(22) Filed: Jul. 24, 2015

(65) Prior Publication Data

US 2016/0072495 A1     Mar. 10, 2016

(30) Foreign Application Priority Data

Sep. 5, 2014   (JP) ................................ 2014-181637

(51) Int. Cl.
*H03H 11/16*     (2006.01)
*H03K 5/26*     (2006.01)
(Continued)

(52) U.S. Cl.
CPC ............. *H03K 5/26* (2013.01); *G01R 25/005* (2013.01); *G01R 25/04* (2013.01); *H04B 17/12* (2015.01); *H01Q 3/267* (2013.01); *H04B 7/04* (2013.01)

(58) Field of Classification Search
None
See application file for complete search history.

(56) References Cited

U.S. PATENT DOCUMENTS

| 2002/0135513 A1 | 9/2002 | Paschen et al. |
| 2006/0144519 A1 | 7/2006 | Kitamura et al. |

(Continued)

FOREIGN PATENT DOCUMENTS

| EP | 0 791 807 A2 | 8/1997 |
| EP | 1 895 662 A1 | 3/2008 |

(Continued)

OTHER PUBLICATIONS

Extended European Search Report of related European Patent Application No. 15178788.4 dated Apr. 15, 2016.

(Continued)

*Primary Examiner* — Cassandra Cox
(74) *Attorney, Agent, or Firm* — Arent Fox LLP

(57) ABSTRACT

A phase adjustment device includes: a detection signal generator configured to generate a pair of first and second detection signals for detecting a phase difference between two signals whose phases have been adjusted by two phase adjusters, respectively, a maximum sensitivity phase difference of one of the first and second detection signals being not overlap with that of the other, and detection sensitivity of the phase difference becoming maximum at the maximum sensitivity phase difference; a detection signal selector configured to select one of the first and second detection signals whose predetermined range around the maximum sensitivity phase difference covers a preset phase difference; and a phase controller configured to control an amount of phase-adjusting by at least one of the two phase adjusters based on a difference between the phase difference detected within the predetermined range using the selected detection signal and the preset phase difference.

10 Claims, 12 Drawing Sheets

(51) Int. Cl.
*G01R 25/04* (2006.01)
*G01R 25/00* (2006.01)
*H04B 17/12* (2015.01)
*H01Q 3/26* (2006.01)
*H04B 7/04* (2017.01)

(56) References Cited

U.S. PATENT DOCUMENTS

| | | |
|---|---|---|
| 2008/0130780 A1 | 6/2008 | Cho et al. |
| 2010/0056070 A1 | 3/2010 | Miyake et al. |
| 2012/0200348 A1 | 8/2012 | Mulvaney |
| 2015/0139352 A1* | 5/2015 | Matsuo ................. H01Q 3/267 |
| | | 375/295 |
| 2015/0365126 A1* | 12/2015 | Shimura ................. H04B 1/40 |
| | | 375/219 |

FOREIGN PATENT DOCUMENTS

| | | |
|---|---|---|
| EP | 2 741 430 A1 | 6/2014 |
| JP | 2010-054218 A | 3/2010 |
| JP | 2013-034129 A | 2/2013 |
| WO | WO 2006/137238 A1 | 12/2006 |

OTHER PUBLICATIONS

Extended European Search Report of European Patent Application 15178788.4 dated Jan. 18, 2016.
U.S. Office Action of related U.S. Appl. No. 15/405,114 dated Jun. 5, 2017.

\* cited by examiner (TO DETECTION SIGNAL SELECTOR 15)

(TO DETECTION SIGNAL SELECTOR 15)

PHASE ADJUSTMENT DEVICE, PHASE DIFFERENCE DETECTING DEVICE AND PHASE-ADJUSTING METHOD

CROSS-REFERENCE TO RELATED APPLICATION

This application is based upon and claims the benefit of priority from the prior Japanese Patent Application No. 2014-181637 filed on Sep. 5, 2014, the entire contents of which are incorporated herein by reference.

FIELD

The embodiments discussed herein are related to a phase adjustment device, a phase difference detecting device, and a phase-adjusting method.

BACKGROUND

There has been known a communication apparatus including a plurality of transmitter for transmitting electromagnetic waves or a plurality of receivers for receiving electromagnetic waves. In such a communication apparatus, a phase calibration is carried out on the signals transmitted through the plurality of transmitters or the plurality of receivers to adjust a phase difference between the transmitted signals to a desired phase difference.

For performing the phase calibration, the communication apparatus includes a phase adjuster in each of the plurality of transmitter or in each of the plurality of receivers. The phase adjuster adjusts the phase of a signal transmitted through each of the plurality of transmitters or each of the plurality of receivers, and outputs a phase-adjusted signal to a mixer. The mixer synthesizes two signals received from two adjacent phase adjusters, respectively, to generate a detection signal for detecting a phase difference between the two signals and outputs the detection signal thus generated to a phase controller. The detection signal generated by the mixer has the maximum sensitivity phase difference where the detection sensitivity of a phase difference becomes maximum. A detection sensitivity of phase difference corresponds to a slope of the waveform of a detection signal. For example, it is assumed that the waveform of a detection signal exhibits a cosine curve. The cosine curve indicates that the characteristics of a detection signal is expressed as a cosine waveform (the signal level (amplitude or power) of the detection signal has a cosine waveform with respect to the phase difference). The detection sensitivity of phase difference becomes maximum at a point where a derivative of the signal level of a detection signal with respect to phase difference (the slope of the waveform) becomes maximum, and the detection sensitivity at the point is the maximum sensitivity phase difference. In this case, the maximum sensitivity phase difference is obtained at $\pm\pi/2$ where the slope of the cosine curve becomes maximum. The phase controller controls the amount of phase-adjusting by two adjacent phase adjusters so that the difference between a phase difference detected within a predetermined range around the maximum sensitivity phase difference by using the detection signal received from the mixer and the preset phase difference is zero.

Related technologies are disclosed in, for example, Japanese Laid-Open Patent Publication No. 2013-34129, Japanese Laid-Open Patent Publication No. 2010-54218.

SUMMARY

According to an aspect of the invention, a phase adjustment device includes: a detection signal generator configured to generate a pair of first and second detection signals for detecting a phase difference between two signals whose phases have been adjusted by two phase adjusters, respectively, a maximum sensitivity phase difference of one of the first and second detection signals being not overlap with that of the other, and detection sensitivity of the phase difference becoming maximum at the maximum sensitivity phase difference; a detection signal selector configured to select one of the first and second detection signals whose predetermined range around the maximum sensitivity phase difference covers a preset phase difference; and a phase controller configured to control an amount of phase-adjusting by at least one of the two phase adjusters based on a difference between the phase difference detected within the predetermined range using the selected detection signal and the preset phase difference.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

There has been a problem in the conventional phase calibration scheme in which the amount of phase-adjusting is determined based on a single detection signal generated by a mixer, in that it is difficult to precisely adjust a phase difference between two signals to certain phase differences.

Specifically, a single detection signal generated by a mixer has a minimum sensitivity phase difference where the detection sensitivity of the phase difference between two signals becomes minimum, at other phase differences than the maximum sensitivity phase difference. For this reason, within a certain range around the minimum sensitivity phase difference, the precision of phase difference detection conducted by using a single detection signal is lowered, and thus, it is difficult to precisely adjust the amount of phase-adjusting by the two adjacent phase adjusters. Consequently, according to the conventional phase calibration scheme, it is difficult to precisely adjust the phase difference between two signals to certain phase differences.

For example, when the single detection signal generated by the mixer exhibits a cosine curve, a phase difference at a point of zero or π where the slope of the cosine curve is minimized is the minimum sensitivity phase difference. Accordingly, around the point of zero or n, the precision of phase difference detection conducted by using the single detection signal is lowered, and thus, it is difficult to precisely adjust the amount of phase-adjusting.

Hereinafter, a technique for enabling a precise phase difference adjustment between two signals to any phase difference according to an embodiment of the present disclosure will be described in detail with reference to the drawings. It is to be understood that the present disclosure is not limited to the embodiment.

First Embodiment

Figure 1:
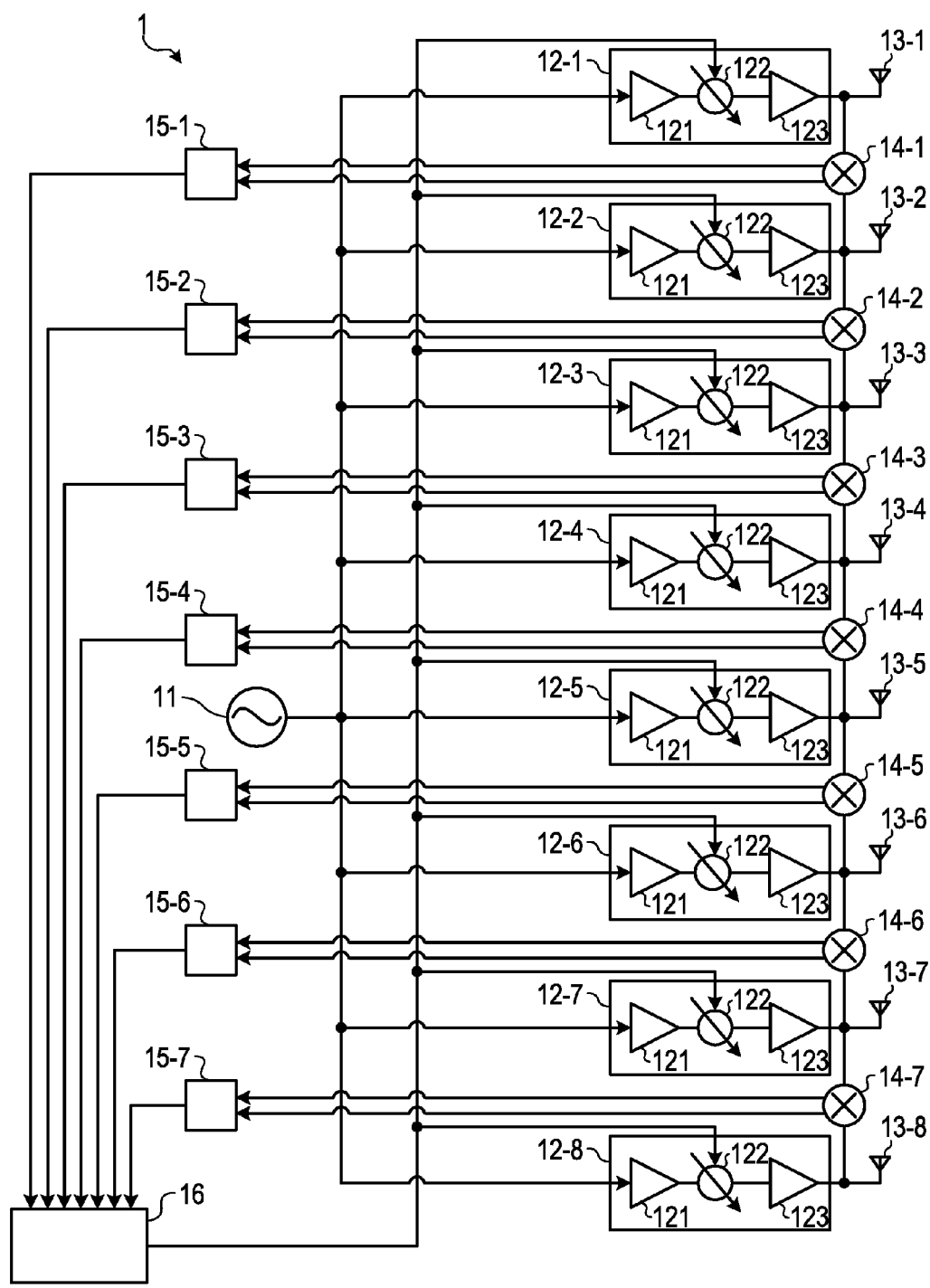
FIG. 1 is a block diagram of an example of a communication apparatus including a phase adjustment device according to a first embodiment.

FIG. 1 is a block diagram of an example of a communication apparatus including a phase adjustment device according to a first embodiment. The communication apparatus 1 illustrated in FIG. 1 includes a signal generator 11, transmitters 12-1 to 12-8, antennas 13-1 to 13-8, detection signal generators 14-1 to 14-7, detection signal selectors 15-1 to 15-7, and a phase controller 16. The phase adjustment device includes the detection signal generators 14-1 to 14-7, the detection signal selectors 15-1 to 15-7, and the phase controller 16, among these.

The transmitters 12-1 to 12-8 all have the same configuration and functionality, and hereinafter, are collectively referred to as a transmitter 12 unless the context specifically states otherwise. Likewise, the antennas 13-1 to 13-8 all have the same configuration and functionality, and hereinafter, are collectively referred to as an antenna 13 unless the context specifically states otherwise. Likewise, the detection signal generators 14-1 to 14-7 all have the same configuration and functionality, and hereinafter, are collectively referred to as a detection signal generator 14 unless the context specifically states otherwise. Likewise, the detection signal selectors 15-1 to 15-7 all have the same configuration and functionality, and hereinafter, are collectively referred to as a detection signal selector 15 unless the context specifically states otherwise.

The single generator 11 generates a signal to be transmitted by the antenna 13 and outputs the generated signal to the transmitter 12.

The transmitter 12 includes a pre-amplifier 121, a phase adjuster 122 and a post-amplifier 123. The pre-amplifier 121 amplifies a signal received from the signal generator 11 and outputs the amplified signal to the phase adjuster 122.

The phase adjuster 122 adjusts the phase of a signal received from the pre-amplifier 121 and outputs the phase-adjusted signal to the post-amplifier 123. An amount by which the phase of a signal is adjusted by the phase adjuster 122 is controlled by the phase controller 16, as will be described below.

The post-amplifier 123 amplifies the signal whose phase has been adjusted by the phase adjuster 122, and outputs the amplified signal to the antenna 13 and the detection signal generator 14.

The antenna 13 receives a signal from the transmitter 12 to radiate the signal as an electromagnetic wave in the free space.

The detection signal generator 14 receives two signals whose phases have been adjusted by the respective phase adjuster 122 (hereinafter referred to appropriately as "two signals") from the two adjacent transmitters 12. The detection signal generator 14 generates first and second detection signals, i.e., a pair of signals for detecting a phase difference between the received two signals. The detection signal generator 14 outputs the generated first and second signals to the detection signal selector 15. The detection signal generator 14 is an example of a phase difference detecting device. Each of the first and second detection signals generated by the detection signal generator 14 has a maximum sensitivity phase difference where detection sensitivity of a phase difference becomes maximum. In addition, the maximum sensitivity phase difference of the first detection signal does not overlap with that of the second detection signal. As used herein, a detection sensitivity of a phase difference corresponds to a slope of a waveform of each of the first and second detection signals. The configuration of the detection signal generator 14 will be described in detail below. In addition, although two adjacent phase adjusters 122 are described as an example, two phase adjusters may not be adjacent to each other. The same applies to embodiments described below.

The detection signal selector 15 receives the first and second detection signals from the detection signal generator 14. The detection signal selector 15 selects one of the first and second detection signals whose predetermined range around the maximum sensitivity phase difference covers the preset phase difference. The preset phase difference refers to a difference between phases of the two adjacent phase adjusters 122 set by the phase controller 16. The detection signal selector 15 outputs the selected detection signal to the phase controller 16.

The phase controller 16 receives the detection signal selected by the detection signal selector 15. The phase controller 16 calculates a difference between the phase difference detected within the predetermined range around the maximum sensitivity difference by using the selected detection signal and the preset phase difference. If the calculated difference is equal to or greater than a threshold value, the phase controller 16 controls the amount of phase-adjusting by at least one of the two adjacent phase adjusters 122, based on the difference.

In this manner, the phase adjustment device according to the first embodiment generates the first and second detection signals for detecting a phase difference between the two signals whose phases have been adjusted by the respective phase adjusters 112, where the maximum sensitivity phase difference of one of the detection signals does not overlap with that of the other. In addition, the phase adjustment device according to the first embodiment selects one of the first and second detection signals whose predetermined range around the maximum sensitivity phase difference covers the preset phase difference. Then, the phase adjustment device according to the first embodiment controls an amount by which one or both of the two phase adjuster 122 adjusts phases using the selected detection signal. Accordingly, in the phase adjustment device according to the first embodiment, a phase difference between two signals within a range from the maximum sensitivity phase difference may be precisely adjusted to any desired phase difference by using one of the first and second detection signals, the maximum sensitivity phase difference of one of which does not overlap with that of the other. As a result, in the phase adjustment device according to the first embodiment, the phase difference between the two signals may be precisely adjusted to any desired phase difference.

Figure 2:
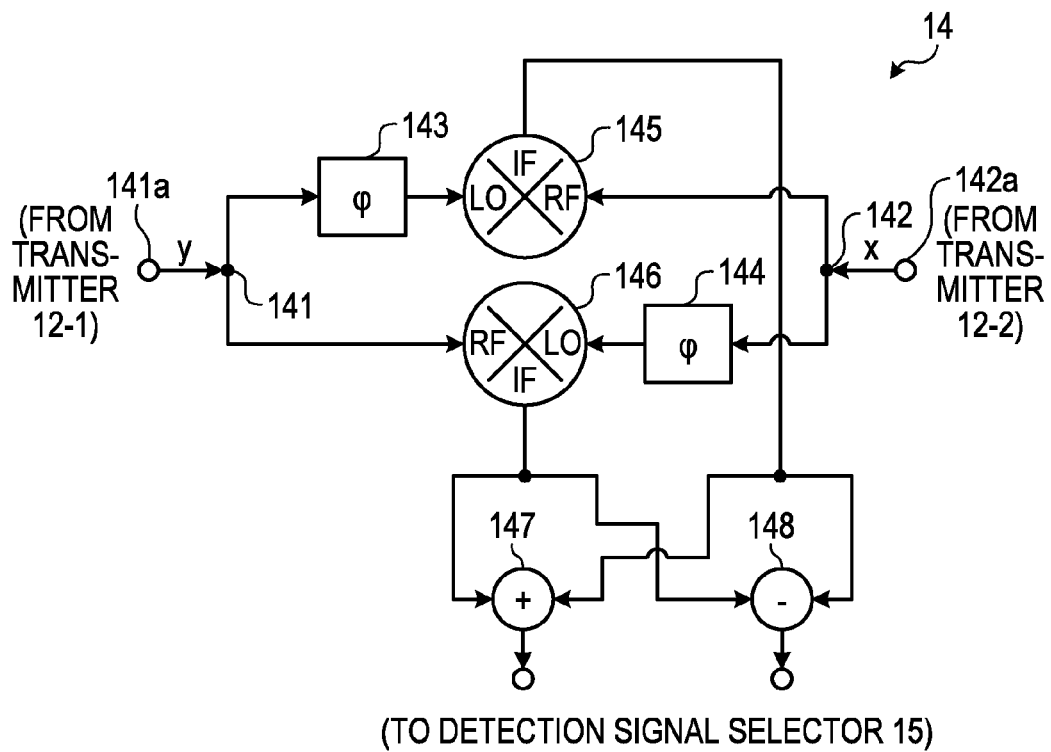
FIG. 2 is a block diagram of an example of a detection signal generator according to the first embodiment.

Next, an example of the configuration of the detection signal generator 14 illustrated in FIG. 1 will be described in detail. FIG. 2 is a block diagram of an example of the detection signal generator according to the first embodiment. It is assumed that the detection signal generator 14 illustrated in FIG. 2 corresponds to the detection signal generator 14-1 illustrated in FIG. 1. The two signals x and y whose phases have been adjusted by the respective phase adjusters 122 may be expressed as Equations (1) and (2), respectively. The phase difference between the two signals x and y may be expressed as Equation (3).

$$x = \frac{1}{2}A\cos(\omega t + \theta_A) \tag{1}$$

$$y = \frac{1}{2}B\cos(\omega t + \theta_B) \tag{2}$$

wherein "t" denotes time, "ω" denotes angular frequency, "θA" and "θB" denote phases, and "A" and "B" denote constants.

$$\theta = \theta_A - \theta_B \tag{3}$$

As illustrated in FIG. 2, the detection signal generator 14 includes a first branch 141, a second branch 142, a first delayer 143, a second delayer 144, a first mixer 145, a second mixer 146, an adder 147, and a subtractor 148.

The two signals x and y whose phase have been adjusted by the respective phase adjusters 122 are received at the detection signal generator 14, and the signal y, which is received from the transmitter 12-1 via an input terminal 141a to be described, branches into first and second branch signals at the first branch 141. At the first branch 141, the first branch signal is output to the first delayer 143 and the second branch signal is output to the second mixer 146.

At the second branch 142, the other one of the two signals x and y, i.e., the signal x, which is received from the transmitter 12-2 via an input terminal 142a to be described, branches into third and fourth branch signals. At the second branch 142, the third branch signal is output to the second delayer 144 and the fourth branch signal is output to the first mixer 145.

The first delayer 143 delays the phase of the first branch signal received from the first branch 141 by a predetermined amount φ. The first delayer 143 outputs a first delayed signal which is obtained by delaying the phase of the first branch signal to the first mixer 145.

The second delayer 144 delays the phase of the third branch signal received from the second branch 142 by a predetermined amount φ. The second delayer 144 outputs a second delayed signal which is obtained by delaying the phase of the third branch signal to the second mixer 146.

The first mixer 145 multiplies the first delayed signal received from the first delayer 143 by the fourth branch signal received from the second branch 142, to generate a signal obtained by synthesizing the first delayed signal and the fourth branch signal. The multiple $Z_1$ of the first delayed signal and the fourth branch signal may be expressed as Equation (4). By removing high frequency component from the multiple $Z_1$, a synthesized signal $Z_{1,DC}$ expressed as Equation (5) is obtained. The first mixer 145 outputs the synthesized signal $Z_{1,DC}$ to the adder 147 and the subtractor 148.

$$Z_1 = \frac{1}{2}A\cos(\omega t + \theta_A) \cdot \frac{1}{2}B\cos(\omega t + \theta_B + \varphi) \tag{4}$$

$$= \frac{AB}{8}\{\cos(2\omega t + \theta_A + \theta_B + \varphi) + \cos(\theta_A - \theta_B - \varphi)\}$$

wherein "φ" denotes amount of phase-delaying by first and second delayers.

$$Z_{1,DC} = \frac{AB}{8}\cos(\theta - \varphi) \tag{5}$$

The second mixer 146 multiplies the second delayed signal received from the second delayer 144 by the second branch signal received from the first branch 141, to generate a signal obtained by synthesizing the second delayed signal and the second branch signal. The multiple $Z_2$ of the second delayed signal and the second branch signal may be expressed as Equation (6). By removing high frequency components from the multiple $Z_2$, a synthesized signal $Z_{2,DC}$ expressed as Equation (7) is obtained. The second mixer 146 outputs the synthesized signal $Z_{2,DC}$ to the adder 147 and the subtractor 148.

$$Z_2 = \frac{1}{2}A\cos(\omega t + \theta_A + \varphi) \cdot \frac{1}{2}B\cos(\omega t + \theta_B) \tag{6}$$

$$= \frac{AB}{8}\{\cos(2\omega t + \theta_A + \theta_B + \varphi) + \cos(\theta_A - \theta_B + \varphi)\}$$

wherein "φ" denotes amount of phase-delaying by first and second delayers.

$$Z_{2,DC} = \frac{AB}{8}\cos(\theta + \varphi) \tag{7}$$

The adder 147 adds the synthesized signal $Z_{2,DC}$ output by the second mixer 146 to the synthesized signal $Z_{1,DC}$ output by the first mixer 145, to generate a first detection signal ($Z_{1,DC}+Z_{2,DC}$). The adder 147 is an example of a calculator. The first detection signal ($Z_{1,DC}+Z_{2,DC}$) may be expressed as Equation (8). That is, the values of the first detection signal ($Z_{1,DC}+Z_{2,DC}$) is in proportion to cos θ·cos φ. The adder 147 outputs the generated first detection signal ($Z_{1,DC}+Z_{2,DC}$) to the detection signal selector 15.

$$z_{1,DC} + Z_{2,DC} = \frac{AB}{8}\{\cos(\theta - \varphi) + \cos(\theta + \varphi)\} \tag{8}$$

$$= \frac{AB}{4} \cdot \cos\theta \cdot \cos\varphi$$

The subtractor 148 subtracts the synthesized signal $Z_{2,DC}$ output by the second mixer 146 from the synthesized signal $Z_{1,DC}$ output by the first mixer 145, to generate a second detection signal ($Z_{1,DC}-Z_{2,DC}$). The subtractor 148 is an example of a calculator. The second detection signal ($Z_{1,DC}-Z_{2,DC}$) may be expressed as Equation (9). That is, the values of the second detection signal ($Z_{1,DC}-Z_{2,DC}$) is in proportion to sin θ·sin φ. The subtractor 148 outputs to the detection signal selector 15 the generated second detection signal ($Z_{1,DC}-Z_{2,DC}$).

$$Z_{1,DC} - Z_{2,DC} = \frac{AB}{8}\{\cos(\theta - \varphi) - \cos(\theta + \varphi)\} \qquad (9)$$
$$= \frac{AB}{4} \cdot \sin\theta \cdot \sin\varphi$$

Referring to FIG. 2, the configuration of the detection signal generator 14 will be described in more detail. In the detection signal generator 14 illustrated in FIG. 2, the first mixer 145 is identical to the second mixer 146. The first delayer 143 is connected to one of two input terminals of the first mixer 145, i.e., a radio frequency terminal (hereinafter referred to as an RF terminal) and a local terminal (hereinafter referred to as an LO terminal). In the example illustrated in FIG. 2, the first delayer 143 is connected to the LO terminal of the first mixer 145. The second delayer 144 is connected to one of two input terminals of the second mixer 146, i.e., an RF terminal and an LO terminal. In the example illustrated in FIG. 2, the second delayer 144 is connected to the LO terminal of the second mixer 146. In addition, the LO terminal of the first mixer 145 to which the first delayer 143 is connected is connected to the RF terminal of the second mixer 146 to which the second delayer is not connected to 114, forming the input terminal 141a via which the signal y from the transmitter 12-1 is received. The input terminal 141a is an example of the first input terminal. In addition, the LO terminal of the second mixer 146 to which the second delayer 144 is connected is connected to the RF terminal of the first mixer 145 to which the first delayer 143 is not connected, forming input terminal 142a via which the signal x from the transmitter 12-2 is received. The input terminal 142a is an example of the second input terminal.

In this manner, in the detection signal generator 14 according to this embodiment, the input terminal 141a and the input terminal 142a are formed to achieve a symmetry between the two input terminals. In this regard, in a typical mixer using transistors, two input terminals of the mixer, i.e., an RF terminal and an LO terminal are often not symmetric to each other. In such a mixer, as the impedance of one input terminal is different from the impedance of the other terminal, reflective property and pass property of the typical mixer deteriorate and an error occurs in detecting a phase different in input signals. In contrast, in the detection signal generator 14 according to this embodiment, the two input terminal 141a and the input terminal 142a are symmetric to each other, so that the impedance of the input terminal 141a is matched to the impedance of the input terminal 142a. Accordingly, the reflective property and the pass property of the detection signal generator 14 according to this embodiment are improved. As a result, it is possible to detect a phase different between the input signals more precisely, compared to the conventional mixers.

Figure 3:
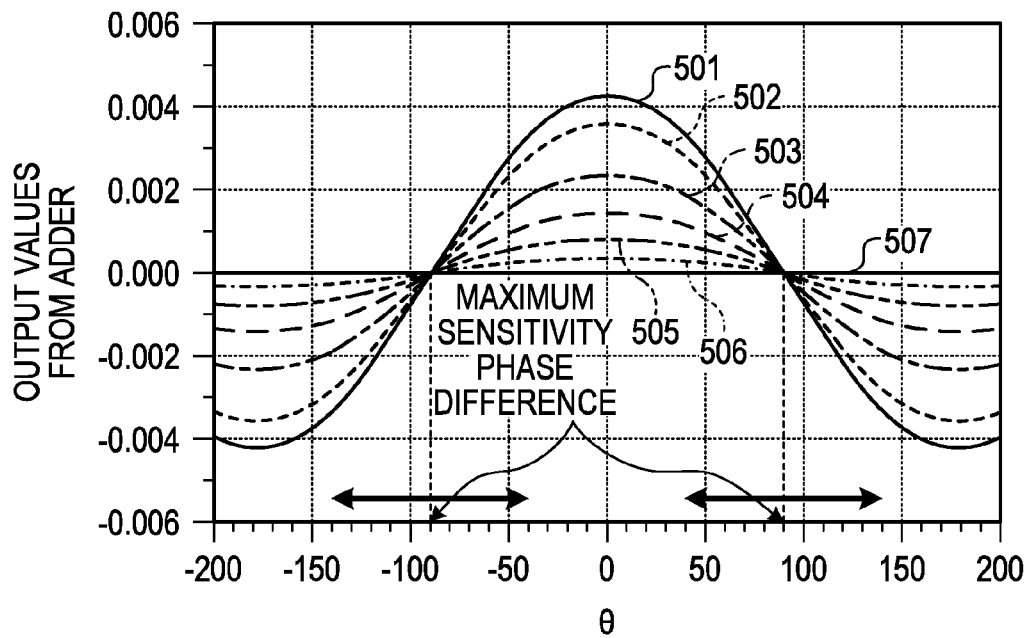
FIG. 3 is a graph illustrating the relationship between a first detection signal and a phase difference θ between two signals x and y.
Figure 4:
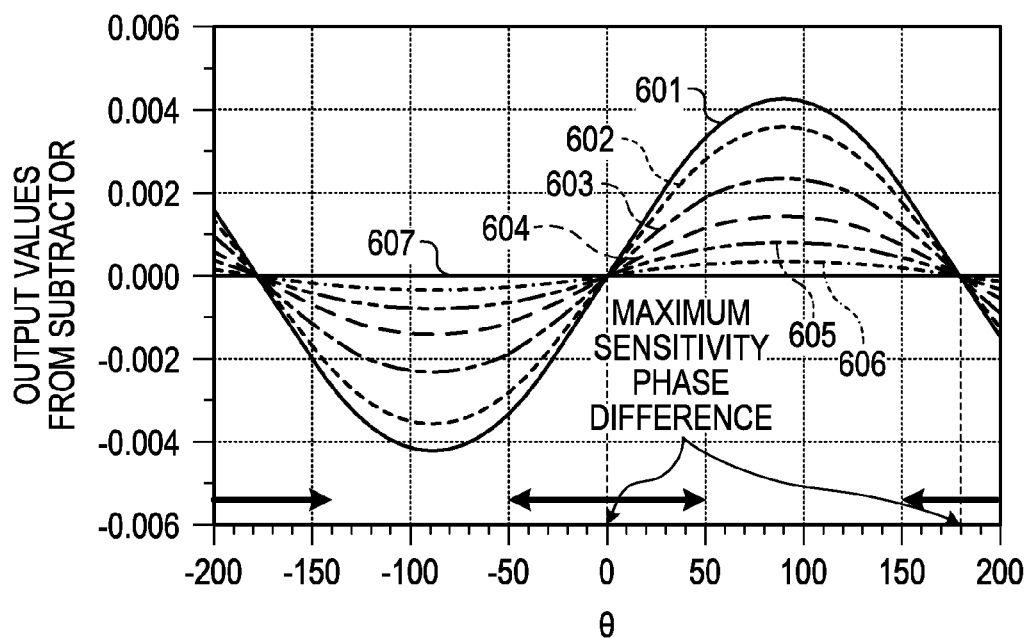
FIG. 4 is a graph illustrating the relationship between a second detection signal and a phase difference θ between two signals x and y.

Next, the relationship between a first detection signal ($Z_{1,DC}+Z_{2,DC}$) and a second detection signal ($Z_{1,DC}-Z_{2,DC}$), and phase-adjusting using the first detection signal and the second detection signal will be described with reference to FIGS. 3 and 4. FIG. 3 is a graph illustrating the relationship between value of the first detection signal and a phase difference θ between the two signals x and y. FIG. 4 is a graph illustrating the relationship between the value of the second detection signal and a phase difference θ between the two signals x and y. In FIGS. 3 and 4, the horizontal axis represents phase difference θ between two signals x and y. In FIG. 3, the vertical axis represents output values from the adder 147, i.e., the first detection signal ($Z_{1,DC}+Z_{2,DC}$). In FIG. 4, the vertical axis represents output values from the subtractor 148, i.e., the second detection signal ($Z_{1,DC}-Z_{2,DC}$).

A curve 501 in the graph of FIG. 3 represents the values of the first detection signal ($Z_{1,DC}+Z_{2,DC}$) when the amount φ of phase-delaying by the first delayer 143 and the second delayer 144 is 0°. A curve 502 in the graph represents the values of the first detection signal ($Z_{1,DC}+Z_{2,DC}$) when the amount φ of phase-delaying by the first delayer 143 and the second delayer 144 is 15°. A curve 503 in the graph represents the values of the first detection signal ($Z_{1,DC}+Z_{2,DC}$) when the amount φ of phase-delaying by the first delayer 143 and the second delayer 144 is 30°. A curve 504 in the graph represents the values of the first detection signal ($Z_{1,DC}+Z_{2,DC}$) when the amount φ of phase-delaying by the first delayer 143 and the second delayer 144 is 45°. A curve 505 in the graph represents the values of the first detection signal ($Z_{1,DC}+Z_{2,DC}$) when the amount φ of phase-delaying by the first delayer 143 and the second delayer 144 is 60°. A curve 506 in the graph represents the values of the first detection signal ($Z_{1,DC}+Z_{2,DC}$) when the amount φ of phase-delaying by the first delayer 143 and the second delayer 144 is 75°. A curve 507 in the graph represents the values of the first detection signal ($Z_{1,DC}+Z_{2,DC}$) when the amount φ of phase-delaying by the first delayer 143 and the second delayer 144 is 90°.

A curve 601 in the graph of FIG. 4 represents the values of the second detection signal ($Z_{1,DC}-Z_{2,DC}$) when the amount φ of phase-delaying by the first delayer 143 and the second delayer 144 is 90°. A curve 602 in the graph represents the values of the first detection signal ($Z_{1,DC}-Z_{2,DC}$) when the amount φ of phase-delaying by the first delayer 143 and the second delayer 144 is 75°. A curve 603 in the graph represents the values of the first detection signal ($Z_{1,DC}-Z_{2,DC}$) when the amount φ of phase-delaying by the first delayer 143 and the second delayer 144 is 60°. A curve 604 in the graph represents the values of the first detection signal ($Z_{1,DC}-Z_{2,DC}$) when the amount φ of phase-delaying by the first delayer 143 and the second delayer 144 is 45°. A curve 605 in the graph represents the values of the first detection signal ($Z_{1,DC}-Z_{2,DC}$) when the amount φ of phase-delaying by the first delayer 143 and the second delayer 144 is 30°. A curve 606 in the graph represents the values of the first detection signal ($Z_{1,DC}-Z_{2,DC}$) when the amount φ of phase-delaying by the first delayer 143 and the second delayer 144 is 15°. A curve 607 in the graph represents the values of the first detection signal ($Z_{1,DC}-Z_{2,DC}$) when the amount φ of phase-delaying by the first delayer 143 and the second delayer 144 is 0°.

As illustrated in FIGS. 3 and 4, each of the first detection signal ($Z_{1,DC}+Z_{2,DC}$) and the second detection signal ($Z_{1,DC}-Z_{2,DC}$) has the maximum sensitivity phase differences where the slope of the waveform has the maximum value. In addition, the maximum sensitivity phase differences of the first detection signal ($Z_{1,DC}+Z_{2,DC}$) do not overlap with the maximum sensitivity phase differences of the second detection signal ($Z_{1,DC}-Z_{2,DC}$). Specifically, the maximum sensitivity phase differences of the first detection signal ($Z_{1,DC}+Z_{2,DC}$) is ±π/2 (=±90°), whereas the maximum sensitivity phase differences of the second detection signal ($Z_{1,DC}-Z_{2,DC}$) is 0° or n. Accordingly, it may be seen that the first detection signal ($Z_{1,DC}+Z_{2,DC}$) and the second detection signal ($Z_{1,DC}-Z_{2,DC}$) have mutual complementary relationships with each other in terms of the maximum sensitivity phase differences.

When the detection signal generator 14 generates two detection signals, i.e., the first detection signal ($Z_{1,DC}+Z_{2,DC}$) and the second detection signal ($Z_{1,DC}-Z_{2,DC}$), the amount $\phi$ of phase-delaying by the first delayer 143 and the second delayer 144 may be set to the values to be described below. That is, the amount $\phi$ of phase-delaying by the first delayer 143 and the second delayer 144 may be set to other values than $\pi/2\cdot n$, wherein "n" is zero or an integer. When the detection signal generator 14 generates two detection signals, i.e., the first detection signal ($Z_{1,DC}+Z_{2,DC}$) and the second detection signal ($Z_{1,DC}-Z_{2,DC}$), and the signal level of the first detection signal ($Z_{1,DC}+Z_{2,DC}$) is maintained equal to that of the second detection signal ($Z_{1,DC}-Z_{2,DC}$), the amount $\phi$ of phase-delaying by the first delayer 143 and the second delayer 144 may be set to the values $\pi\cdot(1/4+\pi/2)$, wherein "n" is zero or an integer.

When the detection signal generator 14 generates one of the first detection signal ($Z_{1,DC}+Z_{2,DC}$) and the second detection signal ($Z_{1,DC}-Z_{2,DC}$), the amount $\phi$ of phase-delaying by the first delayer 143 and the second delayer 144 may be set to the values to be described below. That is, when the detection signal generator 14 generates the first detection signal ($Z_{1,DC}+Z_{2,DC}$) only, the amount $\phi$ of phase-delaying by the first delayer 143 and the second delayer 144 may be set to $\pi\cdot n$, wherein "n" is zero or an integer. In addition, when the detection signal generator 14 generates the second detection signal ($Z_{1,DC}-Z_{2,DC}$) only, the amount $\phi$ of phase-delaying by the first delayer 143 and the second delayer 144 may be set to $\pi\cdot(2\cdot n+1)/2n$, wherein "n" is zero or an integer.

The detection signal selector 15 selects one of the first detection signal ($Z_{1,DC}+Z_{2,DC}$) and the second detection signal ($Z_{1,DC}-Z_{2,DC}$) in FIGS. 3 and 4, whose predetermined range around the maximum sensitivity phase difference covers the preset phase difference. The bold arrows illustrated in FIGS. 3 and 4 indicate predetermined ranges from the maximum sensitivity phase differences, respectively. For example, it is assumed that the preset phase difference is $+\pi/2$ (=+90°). In this case, the detection signal selector 15 selects the first detection signal ($Z_{1,DC}+Z_{2,DC}$) whose predetermined range around the maximum sensitivity phase difference covers the preset phase difference. For another example, it is assumed that the preset phase difference is $-\pi/2$ (=-90°). In this case, the detection signal selector 15 selects the first detection signal ($Z_{1,DC}+Z_{2,DC}$) whose predetermined range around the maximum sensitivity phase difference covers the preset phase difference. For another example, it is assumed that the preset phase difference is zero (=0°). In this case, the detection signal selector 15 selects the second detection signal ($Z_{1,DC}-Z_{2,DC}$) whose predetermined range around the maximum sensitivity phase difference covers the preset phase difference. For another example, it is assumed that the preset phase difference is $\pi$ (=180°). In this case, the detection signal selector 15 selects the second detection signal ($Z_{1,DC}-Z_{2,DC}$) whose predetermined range around the maximum sensitivity phase difference covers the preset phase difference. For another example, it is assumed that the preset phase difference is 10°. In this case, the detection signal selector 15 selects the second detection signal ($Z_{1,DC}-Z_{2,DC}$) whose predetermined range around the maximum sensitivity phase difference (=0°) includes the preset phase difference.

The predetermined range around the maximum sensitivity phase difference will be described below in more detail. As described above, the first detection signal ($Z_{1,DC}+Z_{2,DC}$) and the second detection signal ($Z_{1,DC}-Z_{2,DC}$) are selected so that the minimum detection sensitivity is maximized throughout the entire range of the phase differences $\theta$ between the two signals x and y. Once a predetermined range around the maximum sensitivity phase difference is selected, a switching point (phase difference) at which the first detection signal ($Z_{1,DC}+Z_{2,DC}$) and the second detection signal ($Z_{1,DC}-Z_{2,DC}$) are switched over is determined. The first detection signal ($Z_{1,DC}+Z_{2,DC}$) is in proportion to $\cos\theta$, and the second detection signal ($Z_{1,DC}-Z_{2,DC}$) is in proportion to $\sin\theta$. A point at which the slope of the first detection signal ($Z_{1,DC}+Z_{2,DC}$) with respect to $\theta$ is equal to the slope of the second detection signal ($Z_{1,DC}-Z_{2,DC}$) with respect to $\theta$, i.e., a point at which the detection sensitivities are equal to each other is the switching point. In addition, the phase difference at the switching point is the phase difference $\theta_s$. Throughout the entire range of the phase differences $\theta$, the detection sensitivity becomes minimum at the phase difference $\theta_s$ of the switching point. There are two cases where the slope of the first detection signal ($Z_{1,DC}+Z_{2,DC}$) with respect to $\theta$ is equal to the slope of the second detection signal ($Z_{1,DC}-Z_{2,DC}$) with respect to $\theta$. As one of the cases, there is case A where the signal of the slope of the first detection signal ($Z_{1,DC}+Z_{2,DC}$) with respect to $\theta$ is the same as the sign of the slope of the second detection signal ($Z_{1,DC}-Z_{2,DC}$) with respect to $\theta$. As the other of the cases, there is case B where the signal of the slope of the first detection signal ($Z_{1,DC}+Z_{2,DC}$) with respect to $\theta$ is the opposite to the sign of the slope of the second detection signal ($Z_{1,DC}-Z_{2,DC}$) with respect to $\theta$. In other words, the first detection signal ($Z_{1,DC}+Z_{2,DC}$) and the second detection signal ($Z_{1,DC}-Z_{2,DC}$) have the equal slope in both cases A and B, whereas first detection signal ($Z_{1,DC}+Z_{2,DC}$) and the second detection signal ($Z_{1,DC}-Z_{2,DC}$) have the opposite signs in case B.

The cases A and B will be described with mathematical expressions. To derive the slop $\Delta Z+$ with respect to $\theta$ in Equation (8) above, Equation (8) is differentiated with respect to $\theta$ to obtain Equation (10) below:

$$\frac{d(Z_{1,DC}+Z_{2,DC})}{d\theta} = \Delta Z_+ = -\frac{AB}{4}\cdot\sin\theta\cdot\cos\varphi \tag{10}$$

In addition, to derive the slop $\Delta Z-$ with respect to $\theta$ in Equation (9) above, Equation (9) is differentiated with respect to $\theta$ to obtain Equation (11) below:

$$\frac{d(Z_{1,DC}-Z_{2,DC})}{d\theta} = \Delta Z_- = \frac{AB}{4}\cdot\cos\theta\cdot\sin\varphi \tag{11}$$

As the magnitudes of the slopes are equal to each other and the signs of the slopes are the same in case A, Equation (12) is obtained as below:

$$\Delta Z_+ = \Delta Z_- \tag{12}$$

From Equations (10), (11) and (12), Equation (13) is obtained as below:

$$\tan\theta = -\tan\phi \tag{13}$$

From Equation (13), Equation (14) is obtained as below:

$$\tan\theta_{s1} = -\tan\phi \tag{14}$$

wherein "$\theta_{S1}$" is the phase difference that is the switching point of the selection in case A (hereinafter referred to as the same sign switching point phase difference).

As the magnitudes of the slopes are equal to each other while the signs of the slopes are opposite to each other in case B, Equation (15) is obtained as below:

$$\Delta Z_+ = -\Delta Z_- \quad (15)$$

From Equations (10), (11) and (15), Equation (16) is obtained as below:

$$\tan\theta = \tan\phi \quad (16)$$

From Equation (16), Equation (17) is obtained as below:

$$\tan\theta_{s2} = \tan\phi \quad (17)$$

wherein "$\theta_{S2}$" is the phase difference that is the switching point of the selection in case B (hereinafter referred to as the opposite sign switching point phase difference).

The same sign switching point phase difference $\theta_{s1}$ is expressed as Equation (18) below and the opposite sign switching point phase difference $\theta_{s2}$ is expressed as Equation (19) below:

$$\theta_{s1} = -\phi, 180°-\phi \quad (18)$$

$$\theta_{s2} = \phi, \phi-180° \quad (19)$$

wherein "$\theta$" ranges from $-180°$ to $+180°$.

The predetermined range around the maximum sensitivity phase difference is determined based on the same sign switching point phase difference $\theta_{s1}$ and the opposite sign switching point phase difference $\theta_{s2}$. That is, if the amount $\phi$ of phase-delaying by the first delayer 143 and the second delayer 144 is the amount $\phi_s$, the predetermined range around the maximum sensitivity difference $0°$ may be between $-\phi_s$ and $\phi_s$. The predetermined range around the maximum sensitivity phase difference of $180°$ may range from $-\phi_s+180°$ to $\phi_s+180°$. The predetermined range around the maximum sensitivity phase difference of $90°$ may range from $\phi_s$ to $180°-\phi_s$. The predetermined range around the maximum sensitivity phase difference of $-90°$ may range from $-180°+\phi_s$ to $-\phi_s$. Although it is assumed that the delay amount $\phi_s$ ranges from $0°$ to $90°$ for the convenience of illustration, the technique may be equally practiced in different ranges.

For example, if $\phi_s$ is $45°$, the predetermined range around the maximum sensitivity phase difference of $0°$ may be between $-45°$ and $45°$. The predetermined range around the maximum sensitivity phase difference of $180°$ may range from $135°$ to $225°$. The predetermined range around the maximum sensitivity phase difference of $90°$ may range from $45°$ to $135°$. The predetermined range around the maximum sensitivity phase difference of $-90°$ may range from $-135°$ to $-45°$.

For example, if $\phi_s$ is $30°$, the predetermined range around the maximum sensitivity phase difference of $0°$ may be between $-30°$ and $30°$. The predetermined range around the maximum sensitivity phase difference of $180°$ may range from $150°$ to $210°$. The predetermined range around the maximum sensitivity phase difference of $90°$ may range from $30°$ to $150°$. The predetermined range around the maximum sensitivity phase difference of $-90°$ may range from $-150°$ to $-30°$.

The phase controller 16 calculates a difference between the phase difference detected within the predetermined range around the maximum sensitivity difference using the detection signal selected by the detection signal selector 15 and the preset phase difference. For example, it is assumed that the preset phase difference is $+\pi/2$ ($=+90°$), and the first detection signal ($Z_{1,DC}+Z_{2,DC}$) is selected by the detection signal selector 15. In this case, the phase controller 16 calculates a difference between the phase difference detected within the predetermined range around the maximum sensitivity difference of $+\pi/2$ ($=+90°$) using the first detection signal ($Z_{1,DC}+Z_{2,DC}$) and the preset phase difference of $+\pi/2$ ($=+90°$). Then, the phase controller 16 controls the amount of phase-adjusting by at least one of the two adjacent phase adjusters 122, based on the calculated difference.

Figure 5:
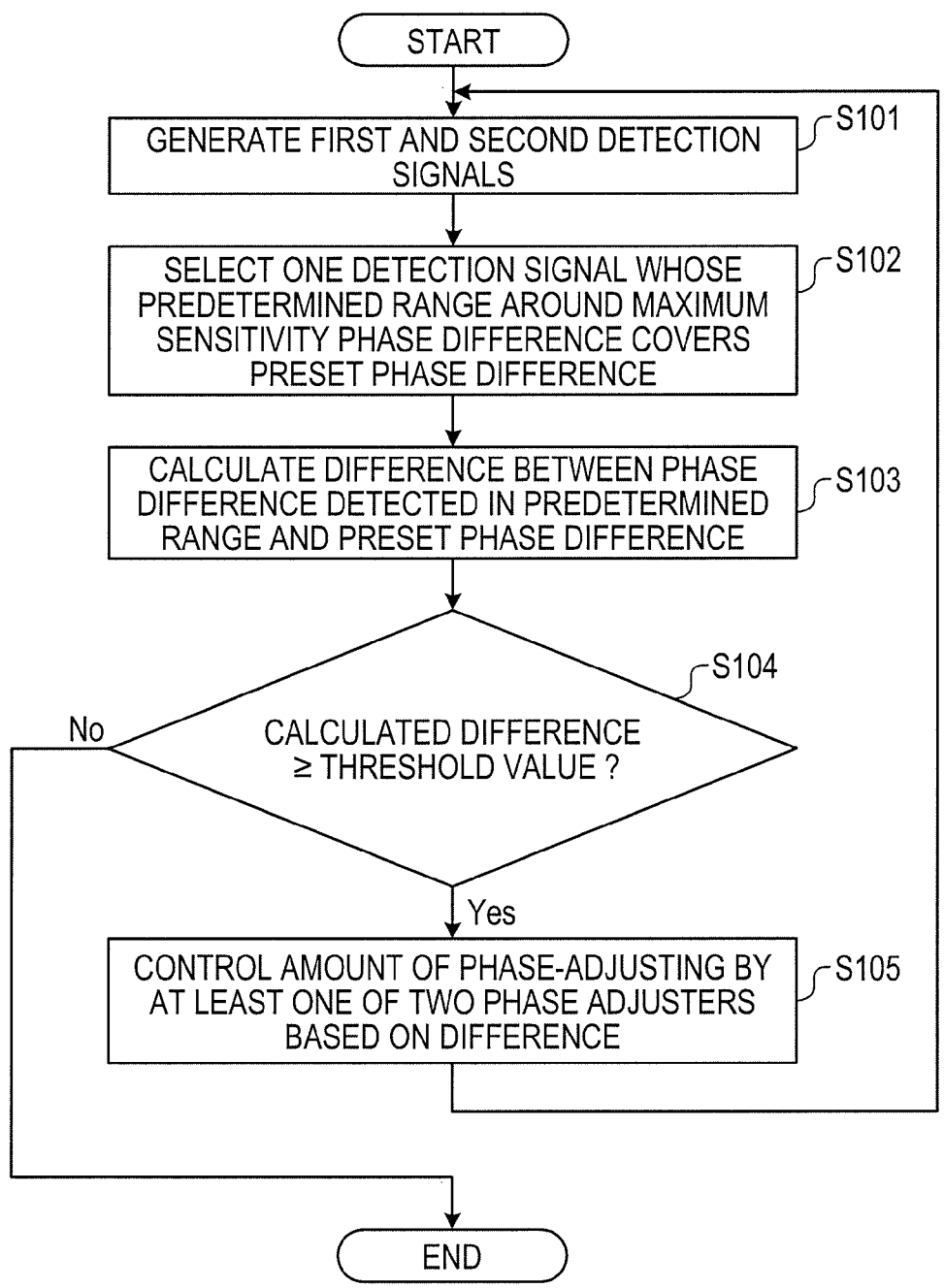
FIG. 5 is a flowchart illustrating a process flow of phase-adjusting by the phase adjustment device according to the first embodiment.

Next, a process flow of the phase-adjusting by the phase adjustment device according to the first embodiment will be described. FIG. 5 is a flowchart illustrating a process flow of the phase-adjusting by the phase adjustment device according to the first embodiment.

As illustrated in FIG. 5, the detection signal generator 14 generates first and second detection signals for detecting a phase difference between two signals whose phases have been adjusted by the respective two phase adjusters 122 (Operation S101).

The detection signal selector 15 selects one of the first and second detection signals whose predetermined range around the maximum sensitivity phase difference covers the preset phase difference (Operation S102).

The phase controller 16 calculates a difference between the phase difference detected within the predetermined range around the maximum sensitivity difference using the selected detection signal and the preset phase difference (Operation S103).

The phase controller 16 determines whether the calculated difference is equal to or greater than a threshold value (Operation S104). If it is determined that the calculated difference is less than the threshold value ("No" in Operation S104), the phase controller 16 terminates the process.

If it is determined that the calculated difference is equal to or greater than the threshold value ("Yes" in Operation S104), the phase controller 16 controls the amount of phase-adjusting by at least one of the two adjacent phase adjusters 122, based on the difference. Then, the process returns to Operation S101. For example, the phase controller 16 increases the amount of phase-adjusting by one of the phase adjusters 122 in proportion to the calculated difference, with the amount of phase-adjusting by the other of the phase adjusters 122 unchanged.

Figure 6:
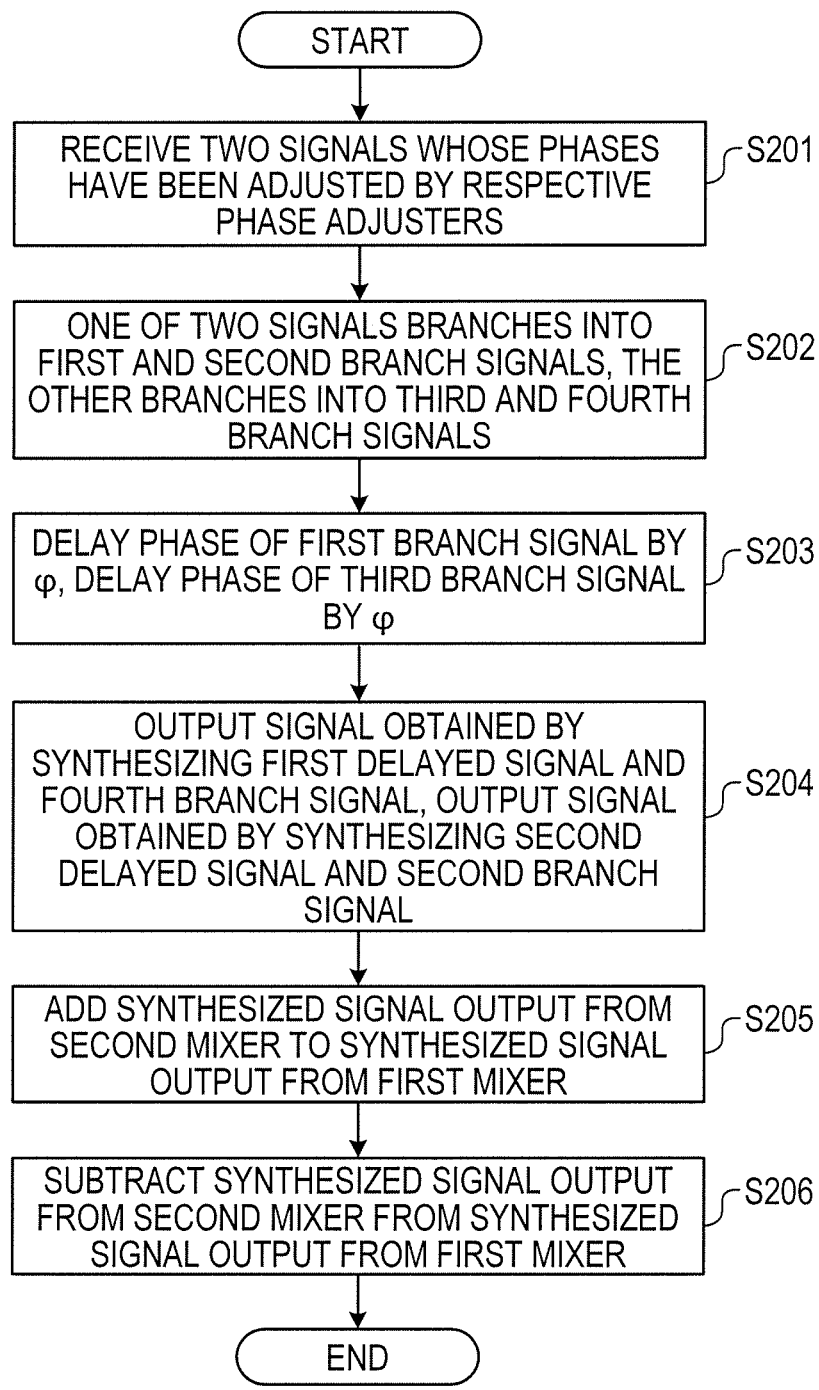
FIG. 6 is a flowchart illustrating a process flow of the detection signal generation by the phase adjustment device according to the first embodiment.

FIG. 6 is a flowchart illustrating a process flow of the detection signal generation by the phase adjustment device according to the first embodiment. The process flow of FIG. 6 illustrates sub-operations that compose Operation S101 illustrated in FIG. 5.

As illustrated in FIG. 6, the detection signal generator 14 receives, from the two adjacent phase adjusters 122, two signals x and y whose phases have been adjusted by the respective phase adjusters 122 (Operation S201).

The two signals x and y are input to the detection signal generator 14, and the signal y received from the transmitter 12-1 branches into first and second branch signals at the first branch 141. In addition, the signal x received from the transmitter 12-2 branches into third and fourth branch signals at the second branch 141 (Operation S202).

The first delayer 143 delays the phase of the first branch signal received from the first branch 141 by a predetermined amount $\phi$, and the second delayer 144 delays the phase of the third branch signal received from the second branch 142 by a predetermined amount $\phi$ (Operation S203).

The first mixer 145 outputs a signal $Z_{1,DC}$ obtained by synthesizing the first delayed signal and the fourth branch signal, and the second mixer 146 outputs a signal $Z_{2,DC}$ obtained by synthesizing the second delayed signal and the second branch signal (Operation S204).

The adder 147 adds the synthesized signal $Z_{2,DC}$ output by the second mixer 146 to the synthesized signal $Z_{1,DC}$ output by the first mixer 145, to generate a first detection signal ($Z_{1,DC}+Z_{2,DC}$) (Operation S205).

The subtractor 148 adds the synthesized signal $Z_{2,DC}$ output by the second mixer 146 to the synthesized signal $Z_{1,DC}$ output by the first mixer 145, to generate a second detection signal ($Z_{1,DC}+Z_{2,DC}$) (Operation S206).

Briefly summarizing the foregoing, the phase adjustment device according to the first embodiment generates the first and second detection signals for detecting a phase difference between the two signals whose phases have been adjusted by the respective phase adjusters 112, where the maximum sensitivity phase differences of the first detection signal do not overlap with those of the second detection signal. In addition, the phase adjustment device according to the first embodiment selects one of the first and second detection signals whose predetermined range around the maximum sensitivity phase difference covers the preset phase difference. Then, the phase adjustment device according to the first embodiment controls an amount of phase-adjusting by at least one of the two phase adjuster 122 using the selected detection signal. Accordingly, in the phase adjustment device according to the first embodiment, a phase difference between two signals within a range around the maximum sensitivity phase difference may be adjusted to any desired phase difference by using one of the first and second detection signals, the maximum sensitivity phase difference of the first detection signal do not overlap with that of the second detection signal. As a result, in the phase adjustment device according to the first embodiment, the phase difference between the two signals may be precisely adjusted to any desired phase difference. Additionally, although the two adjacent transmitters 12 have been described in the first embodiment, the two transmitters 12 may not be adjacent to each other. The detection signal generator 14 may be disposed at a position equally spaced apart from the two transmitters 12. In other words, the detection signal generator 14 may have the equal connection phase length to the two transmitters 12. The detection signal generator 14 may equally be spaced apart from the two transmitters 12 at the shortest distance.

Second Embodiment

In the first embodiment, the amount of phase-delaying by the first delayer 143 and the second delayer 144 is constant. In contrast, in the second embodiment, the amount of phase-delaying by the first delayer 143 and the second delayer 144 is variable. In describing the second embodiment, descriptions will be made focusing on the differences from the first embodiment. The same elements as the first embodiment are denoted by the like reference numerals and will not be described.

Figure 7:
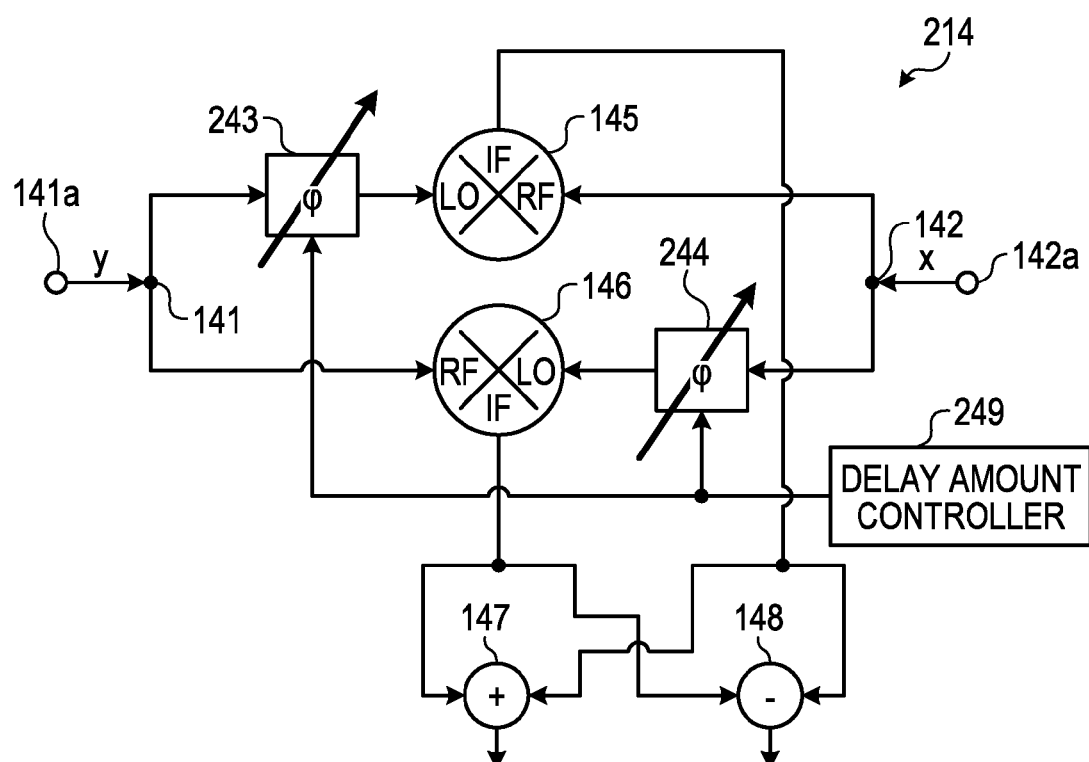
FIG. 7 is a block diagram of an example of a detection signal generator according to the second embodiment.

FIG. 7 is a block diagram of an example of a detection signal generator according to the second embodiment. It is assumed that the detection signal generator 214 illustrated in FIG. 7 corresponds to the detection signal generator 14-1 illustrated in FIG. 1.

As illustrated in FIG. 7, the detection signal generator 214 includes a first branch 141, a second branch 142, a first delayer 243, a second delayer 244, a first mixer 145, a second mixer 146, an adder 147, a subtractor 148, and a delay amount controller 249.

The first delayer 243 delays the phase of a first branch signal received from the first branch 141 by a predetermined amount ϕ. It is to be noted that the amount ϕ of phase-delaying by the first delayer 243 is variable and is controlled by the delay amount controller 249. The first delayer 243 outputs a first delayed signal which is obtained by delaying the phase of the first branch signal to the first mixer 145.

The second delayer 244 delays the phase of a third branch signal received from the second branch 142 by a predetermined amount ϕ. It is to be noted that the amount ϕ of phase-delaying by the second delayer 244 is variable and is controlled by the delay amount controller 249. The second delayer 244 outputs a second delayed signal which is obtained by delaying the phase of the third branch signal to the second mixer 146.

The delay amount controller 249 controls the amount ϕ of phase-delaying by the first delayer 243 and the second delayer 244 based on a preset phase difference, to maximize the amplitude of the first detection signal or the second detection signal. Specifically, when the predetermined range around ±π/2 covers the preset phase difference, the delay amount controller 249 sets the amount ϕ of phase-delaying by the first delayer 243 and the second delayer 244 to zero or π, to maximize the amplitude of the first detection signal. In this case, the second detection signal is zero.

In the meantime, when the predetermined range around zero or π covers the preset phase difference, the delay amount controller 249 sets the amount ϕ of phase-delaying by the first delayer 243 and the second delayer 244 to ±π/2, to maximize the amplitude of the second detection signal. In this case, the first detection signal is zero.

Figure 8:
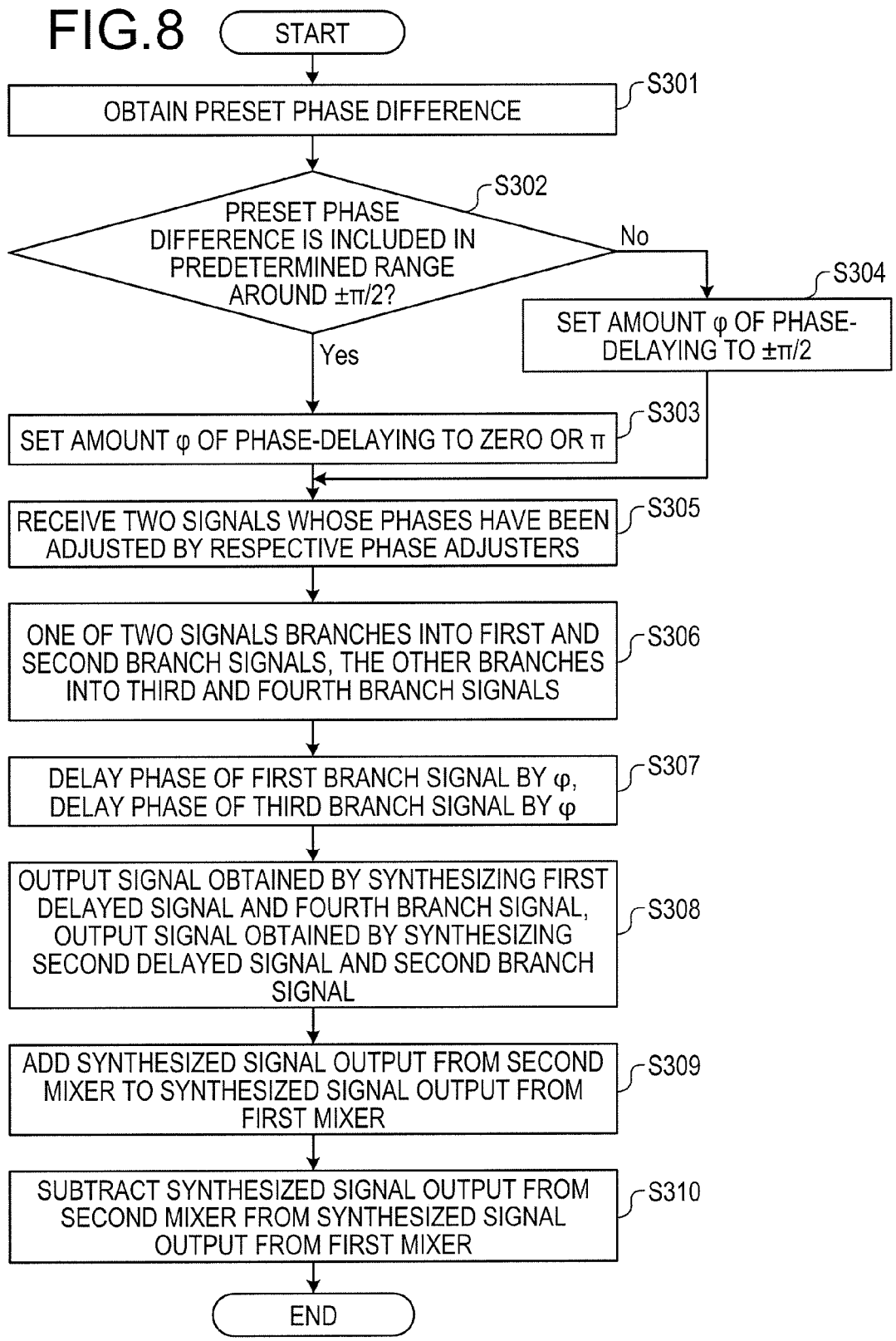
FIG. 8 is a flowchart illustrating a process flow of detection signal generation by the phase adjustment device according to the second embodiment.

Next, a process flow of detection signal generation by the phase adjustment device according to the second embodiment will be described. FIG. 8 is a flowchart illustrating a process flow of detection signal generation by the phase adjustment device according to the second embodiment. The process flow of FIG. 8 illustrates sub-operations that compose Operation S101 illustrated in FIG. 5. Operations S305 to S310 illustrated in FIG. 8 are identical to Operations S201 to S206 illustrated in FIG. 6, respectively, and will not be described to avoid redundancy.

As illustrated in FIG. 8, the delay amount controller 249 of the detection signal generator 214 acquires a preset phase difference (Operation S301), and determines whether the predetermined range around ±π/2 covers the preset phase difference (Operation S302). If it is determined that the predetermined range around ±π/2 covers the preset phase difference ("Yes" in Operation S302), the delay amount controller 249 performs the following operation: the delay amount controller 249 sets the amount ϕ of phase-delaying by the first delayer 243 and the second delayer 244 to zero or π, to maximize the amplitude of the first detection signal (S303). Then, the process proceeds to Operation S305.

In the meantime, if the predetermined range around ±π/2 does not cover the preset phase difference ("No" in Operation S302), the delay amount controller 249 determines that the predetermined range around zero or π covers the preset phase difference, and performs the following operation: the delay amount controller 249 sets the amount ϕ of phase-delaying by the first delayer 243 and the delay amount controller 249 to ±π/2, to maximize the amplitude of the second detection signal (S304). Then, the process proceeds to Operation S305.

As described above, the phase adjustment device according to the second embodiment controls the amount ϕ of phase-delaying by the first delayer 243 and the second delayer 244 based on the preset phase difference, to maximize the amplitude of the first detection signal or the second detection signal. By doing so, the phase adjustment device according to the second embodiment may further improve the precision of phase-detection compared to the first embodiment.

Third Embodiment

In the first embodiment, the amount of phase-delaying by the first delayer 143 and the second delayer 144 is constant. In contrast, in the third embodiment, the amount of phase-delaying by the first delayer 143 and the second delayer 144 may be switched to a desired value. In describing the third embodiment, descriptions will be made focusing on the differences from the first embodiment. The same elements as the first embodiment are denoted by the like reference numerals and will not be described.

Figure 9:
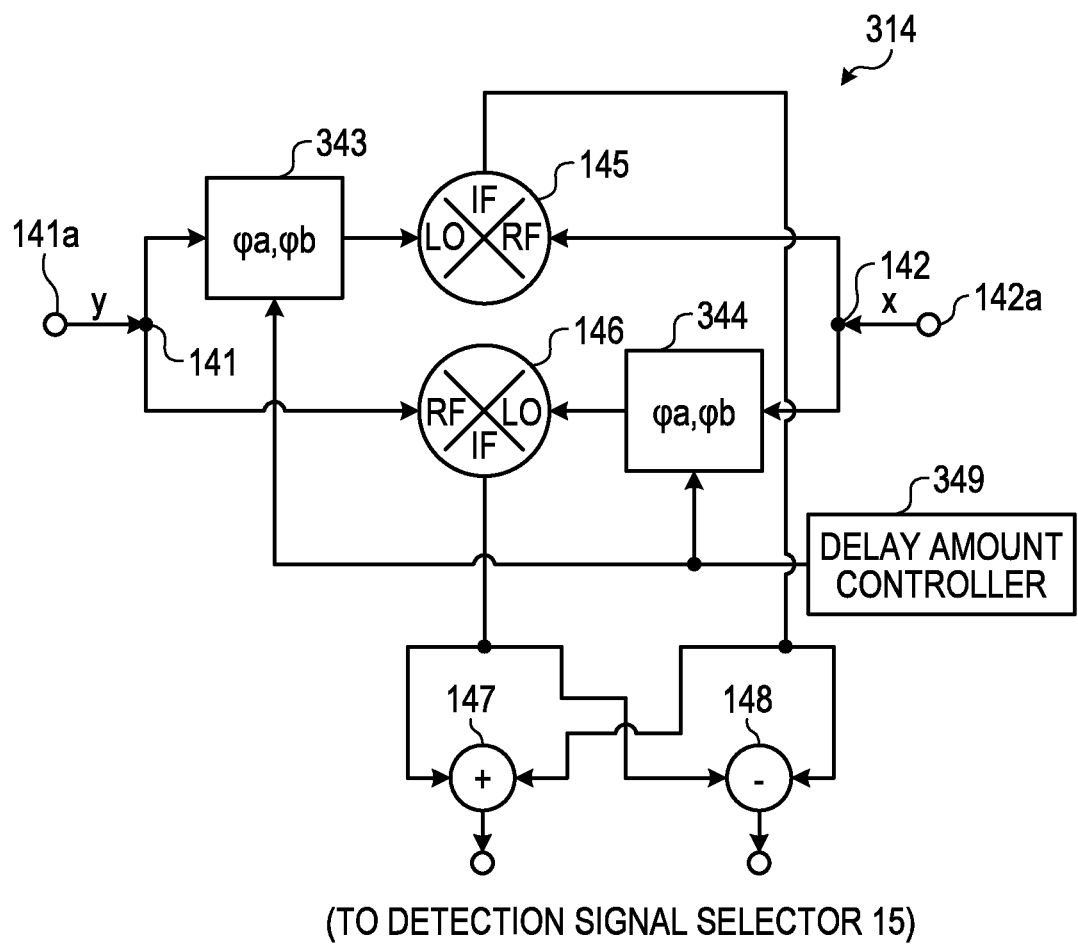
FIG. 9 is a block diagram of an example of a detection signal generator according to a third embodiment.

FIG. 9 is a block diagram of an example of a detection signal generator according to the third embodiment. It is assumed that the detection signal generator 314 illustrated in FIG. 9 corresponds to the detection signal generator 14-1 illustrated in FIG. 1.

As illustrated in FIG. 9, the detection signal generator 314 includes a first branch 141, a second branch 142, a first delayer 343, a second delayer 344, a first mixer 145, a second mixer 146, an adder 147, a subtractor 148, and a delay amount controller 349.

The first delayer 343 delays the phase of a first branch signal received from the first branch 141 by a predetermined amount $\phi$. It is to be noted that the amount $\phi$ of phase-delaying by the first delayer 343 is switched between $\phi_a$ (=zero or n) and $\phi_b$ (=±π/2) under the control of the delay amount controller 349. The first delayer 343 outputs a first delayed signal which is obtained by delaying the phase of the first branch signal to the first mixer 145.

The second delayer 344 delays the phase of a third branch signal received from the second branch 142 by a predetermined amount $\phi$. It is to be noted that the amount $\phi$ of phase-delaying by the second delayer 344 is switched between $\phi_a$ (=zero or n) and $\phi_b$ (=±π/2) under the control of the delay amount controller 349. The second delayer 344 outputs a second delayed signal which is obtained by delaying the phase of the third branch signal to the second mixer 146.

The delay amount controller 349 switches between the amounts $\phi$ of phase-delaying by the first delayer 343 and the second delayer 344 based on a preset phase difference, to maximize the amplitude of the first detection signal or the second detection signal. Specifically, when the predetermined range around ±π/2 covers the preset phase difference, the delay amount controller 349 switches the amount $\phi$ of phase-delaying by the first delayer 343 and the second delayer 344 to $\phi_a$ (=zero or π), to maximize the amplitude of the first detection signal. In this case, the second detection signal is zero.

In the meantime, when the predetermined range around zero or π covers the preset phase difference, the delay amount controller 349 switches the amount $\phi$ of phase-delaying by the first delayer 343 and the second delayer 344 to $\phi_b$ (=±π/2), to maximize the amplitude of the first detection signal. In this case, the first detection signal is zero.

Figure 10:
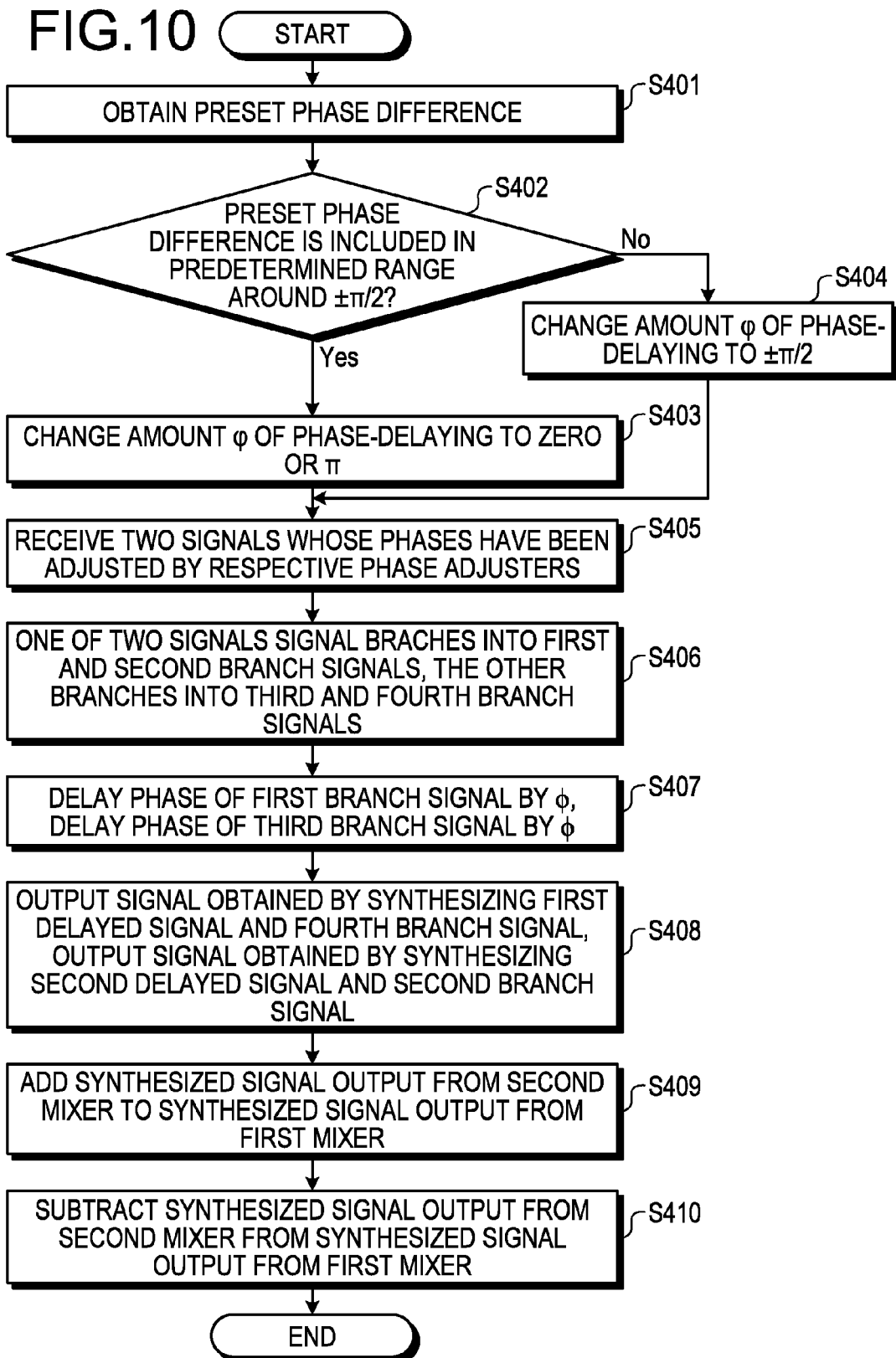
FIG. 10 is a flowchart illustrating a process flow of detection signal generation by a phase adjustment device according to the third embodiment.

Next, a process flow of detection signal generation by the phase adjustment device according to the third embodiment will be described. FIG. 10 is a flowchart illustrating a process flow of detection signal generation by a phase adjustment device according to the third embodiment. The process flow of FIG. 10 illustrates sub-operations that compose Operation S101 illustrated in FIG. 5. Operations S405 to S410 illustrated in FIG. 10 are identical to Operations S201 to S206 illustrated in FIG. 6, respectively, and will not be described to avoid redundancy.

As illustrated in FIG. 10, the delay amount controller 349 of the detection signal generator 314 acquires a preset phase difference (Operation S401), and determines whether the predetermined range around ±π/2 covers the preset phase difference (Operation S402). If it is determined that the predetermined range around ±π/2 covers the preset phase difference ("Yes" in Operation S402), the delay amount controller 349 performs the following operation: the delay amount controller 349 switches the amount $\phi$ of phase-delaying by the first delayer 343 and the second delayer 344 to $\phi_a$ (=zero or π), to maximize the amplitude of the first detection signal (S403). Then, the process proceeds to Operation S405.

In the meantime, if the predetermined range around ±π/2 does not cover the preset phase difference ("No" in Operation S402), the delay amount controller 349 determines that the predetermined range around zero or π covers the preset phase difference, and performs the following operation: the delay amount controller 349 switches the amount $\phi$ of phase-delaying by the first delayer 343 and the delay amount controller 349 to $\phi_b$ (=±π/2), to maximize the amplitude of the second detection signal (Operation S404). Then, the process proceeds to Operation S405.

As described above, the phase adjustment device according to the third embodiment switches the amounts $\phi$ of phase-delaying by the first delayer 343 and the second delayer 344 based on the preset phase difference, to maximize the amplitude of the first detection signal or the second detection signal. By doing so, the phase adjustment device according to the second embodiment may further improve the precision of phase-detection compared to the first embodiment.

Fourth Embodiment

In the first embodiment, the first mixer 145 and the second mixer 146 multiply a single-ended signal by another single ended signal to generate a synthesized signal. In contrast, in the fourth embodiment, the first mixer 145 and the second mixer 146 multiply a single-ended signal by a differential signal to generate a synthesized signal. In describing the fourth embodiment, descriptions will be made focusing on the differences from the first embodiment. The same elements as the first embodiment are denoted by the like reference numerals and will not be described.

Figure 11:
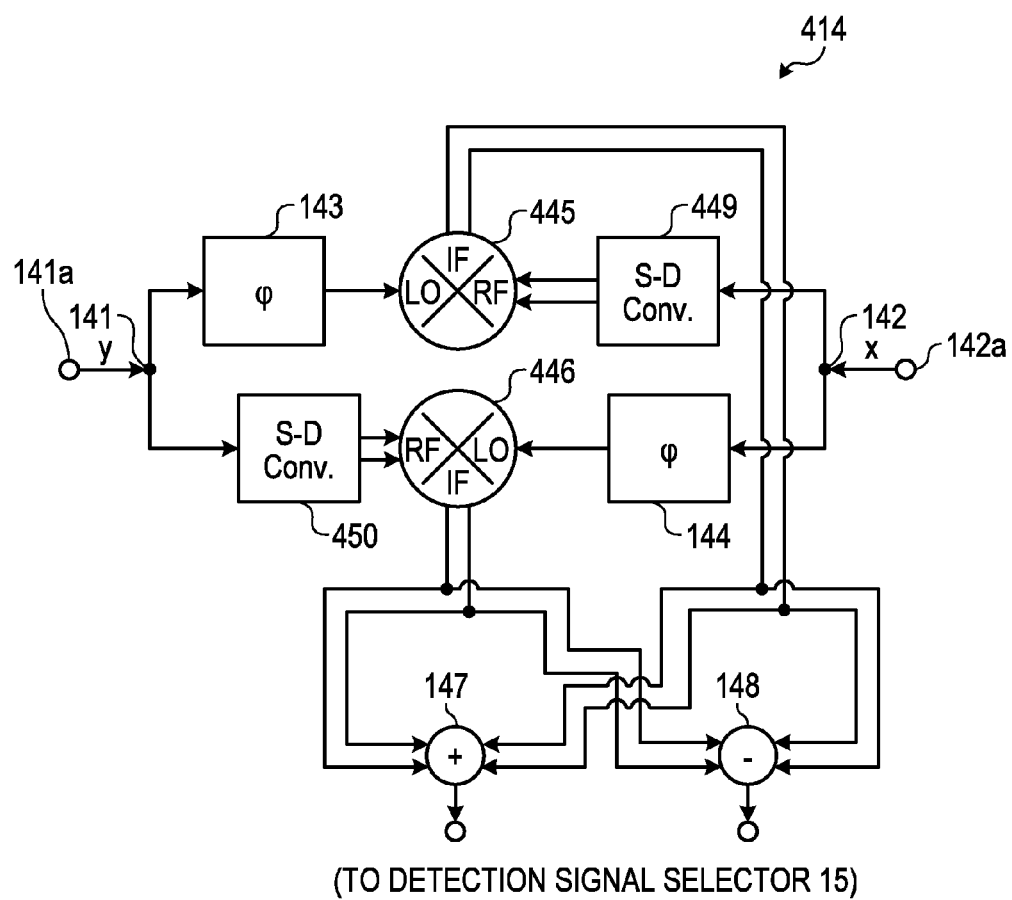
FIG. 11 is a block diagram of an example of a detection signal generator according to a fourth embodiment.

FIG. 11 is a block diagram of an example of a detection signal generator according to a fourth embodiment. It is assumed that the detection signal generator 414 illustrated in FIG. 11 corresponds to the detection signal generator 14-1 illustrated in FIG. 1.

As illustrated in FIG. 11, the detection signal generator 414 includes a first branch 141, a second branch 142, a first delayer 143, a second delayer 144, a first mixer 445, a second mixer 446, an adder 147 and a subtractor 148. The detection signal generator 414 further includes an S(Serial)-D(Differential) converter 449 and an S-D converter 450.

The S-D converter 449 converts a fourth branch signal received from the second branch 142 into a differential signal, and outputs the converted fourth branch signal to the first mixer 445. The S-D converter 449 is an example of a first differential signal converter.

The S-D converter 450 converts a second branch signal received from the first branch 141 into a differential signal, and outputs the converted second branch signal to the second mixer 446. The S-D converter 450 is an example of a second differential signal converter.

The first mixer 445 multiplies the fourth branch signal converted by the S-D converter 449 by the first delayed signal received from the first delayer 143, to generate a signal obtained by synthesizing the fourth branch signal and the first delayed signal. The first mixer 445 outputs the synthesized signal to the adder 147 and the subtractor 148.

The second mixer 446 multiplies the second branch signal converted by the S-D converter 550 by the second delayed signal received from the second delayer 144, to generate a signal obtained by synthesizing the second branch signal and the second delayed signal. The second mixer 446 outputs the synthesized signal to the adder 147 and the subtractor 148.

As described above, in the fourth embodiment, the first mixer 145 and the second mixer 146 multiply a single-ended signal by a differential signal to generate a synthesized signal. Accordingly, the phase adjustment according to the fourth embodiment may generate a synthesized signal that is less affected by noise.

Fifth Embodiment

In the first embodiment, the first mixer 145 and the second mixer 146 multiply a single-ended signal by another single ended signal to generate a synthesized signal. In contrast, in the fifth embodiment, the first mixer 145 and the second mixer 146 multiply a differential signal by another differential signal to generate a synthesized signal. In describing the fifth embodiment, descriptions will be made focusing on the differences from the first embodiment. The same elements as the first embodiment are denoted by the like reference numerals and will not be described.

Figure 12:
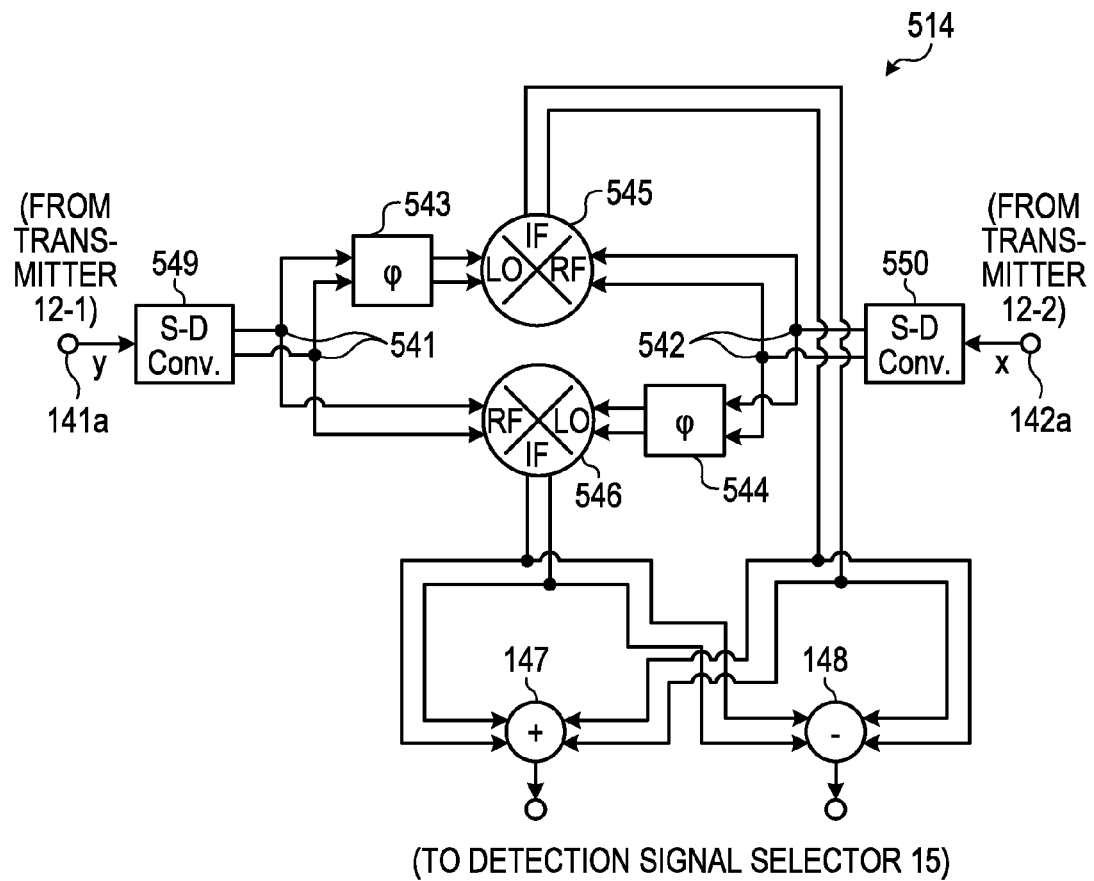
FIG. 12 is a block diagram of an example of a detection signal generator according to a fifth embodiment.

FIG. 12 is a block diagram of an example of a detection signal generator according to a fifth embodiment. It is assumed that the detection signal generator 514 illustrated in FIG. 12 corresponds to the detection signal generator 14-1 illustrated in FIG. 1.

As illustrated in FIG. 12, the detection signal generator 514 includes a first branch 541, a second branch 542, a first delayer 543, a second delayer 544, a first mixer 545, a second mixer 546, an adder 147, and a subtractor 148. The detection signal generator 514 further includes an S-D converter 549 and an S-D converter 550.

The S-D converter 549 converts one of two signals x and y whose phase have been adjusted by the respective phase adjusters 122, in this example the signal y received from the transmitter 12-1, into a differential signal. The S-D converter 549 outputs the converted signal y to the first branch 541.

The S-D converter 550 converts one of two signals x and y whose phase have been adjusted by the respective phase adjusters 122, in this example the signal x received from the transmitter 12-2, into a differential signal. The S-D converter 550 outputs the converted signal x to the second branch 542.

The signal y, which is output from the S-D converter 549 as a differential signal, branches into first and second branch signals at the first branch 541. At the first branch 541, the first branch signal is output to the first delayer 543 and the second branch signal is output to the second mixer 546.

The signal x, which is output from the S-D converter 550 as another differential signal, branches into third and fourth branch signals at the second branch 542. At the second branch 542, the third branch signal is output to the second delayer 544 and the fourth branch signal is output to the first mixer 545.

The first delayer 543 delays the phase of the first branch signal received from the first branch 541 by a predetermined amount φ. The first delayer 543 outputs to the first mixer 145 a first delayed signal which is obtained by delaying the phase of the first branch signal as a differential signal.

The second delayer 544 delays the phase of the third branch signal received from the second branch 542 by a predetermined amount φ. The second delayer 544 outputs a second delayed signal which is obtained by delaying the phase of the third branch signal as another differential signal to the second mixer 546.

The first mixer 545 multiplies the first delayed signal received from the first delayer 543 by the fourth branch signal received from the second branch 542, to generate a signal obtained by synthesizing the first delayed signal and the fourth branch signal. The first mixer 545 outputs the synthesized signal to the adder 147 and the subtractor 148.

The second mixer 546 multiplies the second delayed received from the second delayer 544 by the second branch signal received from the first branch 541, to generate a signal obtained by synthesizing the second delayed signal and the second branch signal. The second mixer 546 outputs the synthesized signal to the adder 147 and the subtractor 148.

Figure 13:
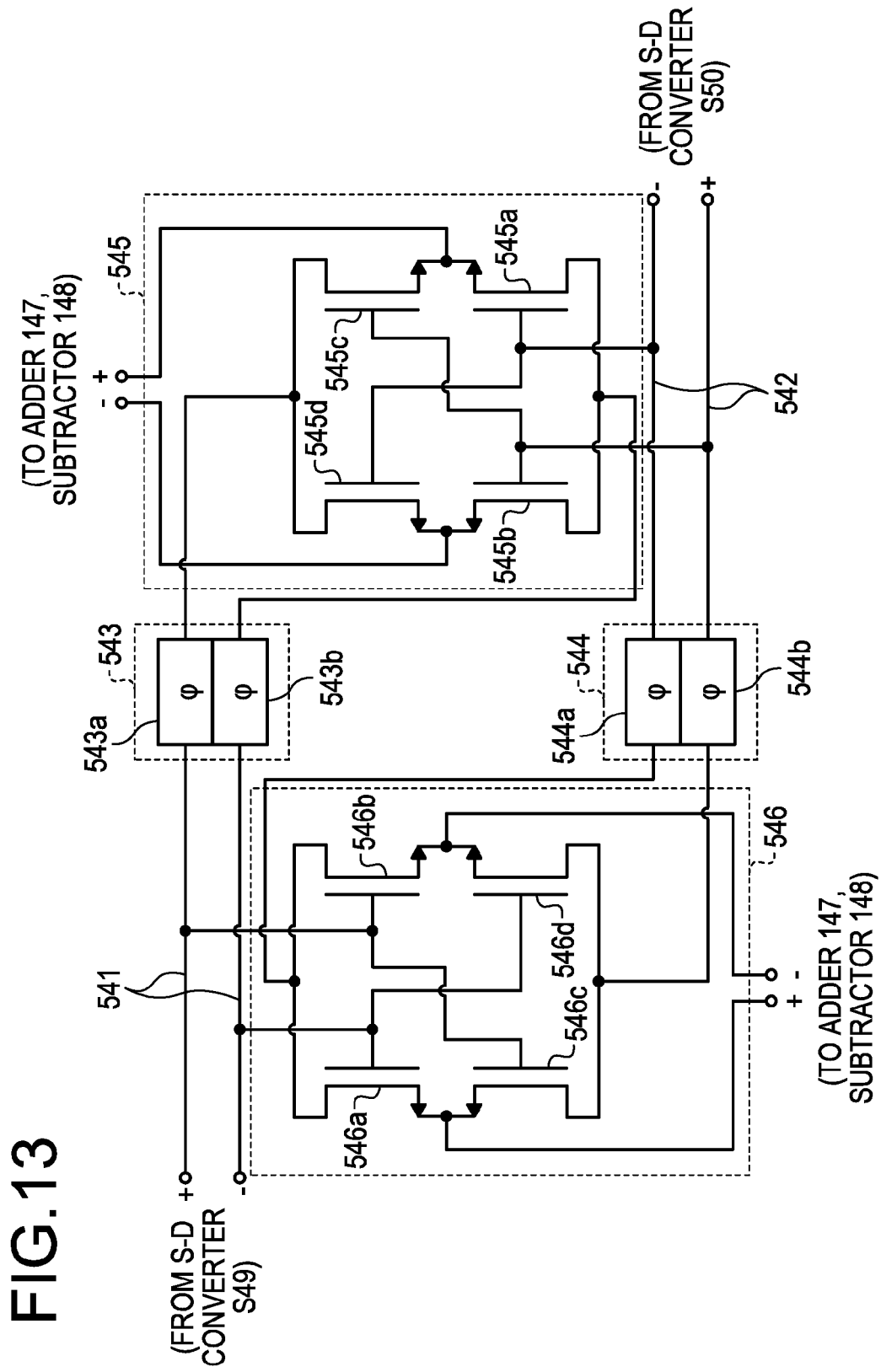
FIG. 13 is a diagram for illustrating configurations of a first delayer, a second delayer, a first mixer and a second mixer illustrated in FIG. 12.

The configurations of the first delayer 543, the second delayer 544, the first mixer 545, and the second mixer 546 illustrated in FIG. 12 will be described in detail with reference to FIG. 13. FIG. 13 is a diagram for illustrating configurations of the first delayer, the second delayer, the first mixer, and the second mixer illustrated in FIG. 12. In FIG. 13, some elements which are not related to the following descriptions such as a bias circuit and a matching circuit are not depicted. In addition, in the following description, each of the first mixer 545 and the second mixer 546 illustrated in FIG. 12 has two input terminals, i.e., an RF terminal and an LO terminal, and one output terminal, i.e., an IF terminal.

As illustrated in FIG. 13, the first mixer 545 and the second mixer 546 are configured as so-called double-balanced resistive mixers. Specifically, the first mixer 545 is a double-balanced mixer implemented using four transistors 545a to 545d, and the second mixer 546 is a double-balanced mixer implemented using four transistors 546a to 546d. The gate terminals of the transistors 545a to 545d correspond to the LO terminal of the first mixer 545 illustrated in FIG. 12, and the gate terminals of the transistors 546a to 546d correspond to the LO terminal of the second mixer 546 illustrated in FIG. 12. The drain terminals of the transistors 545a to 545d correspond to the RF terminal of the first mixer 545 illustrated in FIG. 12, and the drain terminals of the transistors 546a to 546d correspond to the RF terminal of the second mixer 546 illustrated in FIG. 12. The source terminals of the transistors 545a to 545d correspond to the IF terminal of the first mixer 545 illustrated in FIG. 12, and the source terminals of the transistors 546a to 546d correspond to the IF terminal of the second mixer 546 illustrated in FIG. 12. No bias potential is applied between the drain terminals and the source terminals of the transistors 545a to 545d and 546a to 546d. Accordingly, the first mixer 545 and the second mixer 546 are configured as double-balanced resistive mixers. Each of the first mixer 545 and the second mixer 546 receives signals via the drain terminals (RF terminal), performs switching operations depending on a signal from the gate terminals, and mixes (multiplies) the signals to output an output signal via the source terminals (IF terminal). In this example, a pair of delay lines 543a and 543b and a pair of delay lines 544a and 544b are connected to the respective LO terminals. The LO terminals are connected to the input terminal 141*a* and the input terminal 142*a* of the detection signal generator 14, respectively. Alternatively, the pairs of the delay lines may be connected to the RF terminals instead of the LO terminals. The RF terminals may be connected to the input terminals 141*a* and input terminals 142*a* of the detection signal generator 14, respectively. The delay phases of the delay lines 543*a*, 543*b*, 544*a* and 544*b* are all equal. The pair of delay lines 543*a* and 543*b* corresponds to the first delayer 543 illustrated in FIG. 12. The pair of delay lines 544*a* and 544*b* corresponds to the second delayer 544 illustrated in FIG. 12. In addition, in this example, the detection signal generator 514 is implemented with two mixers with delay lines connected thereto, i.e., the first mixer 545 and the second mixer 546. Further, an equivalent circuit configuration is established when the circuit is seen from the two input terminals of the detection signal generator 514. The pair of delay lines 543*a* and 543*b* is connected to one differential input terminal of the detection signal generator 514, and the pair of delay lines 544*a* and 544*b* is connected to the other differential input terminal of the detection signal generate 514. As such, the circuit configuration when seen from the two input terminals of the detection signal generator 514 is equivalent. Accordingly, impedances of the two input terminals are also equal to each other, so that two signals are compared with each other under the same input conditions. As a result, it is possible to eliminate errors caused by input conditions (difference in impedance).

As described above, in the fifth embodiment, the first mixer 545 and the second mixer 546 multiply a differential signal by another differential signal to generate a synthesized signal. Accordingly, the phase adjustment according to the fifth embodiment may generate a synthesized signal that is far less affected by noise.

Thus far, exemplary embodiments of the phase adjustment device and the phase-adjusting method have been described. Other embodiments than those described above are possible as well.

Although the phase adjustment device according to any one of the first to fifth embodiments of the present disclosure is employed by the communication apparatus including a plurality of transmitters, embodiments of the present disclosure is not limited thereto. For example, the phase adjustment device may be employed by a communication apparatus including a plurality of receivers.

Although the phase adjustment device according to any one of the first to fifth embodiments of the present disclosure is employed by the radio frequency communication apparatus in which electromagnetic waves are radiated from the antennas, embodiments of the present disclosure is not limited thereto. For example, the phase adjustment device may be employed by a wired communication apparatus which transmits multiple signals in parallel such as a high-speed IO communication device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:
1. A phase adjustment device comprising:
a detection signal generator configured to generate a pair of first and second detection signals for detecting a phase difference between two signals whose phases have been adjusted by two phase adjusters, respectively, a maximum sensitivity phase difference of one of the first and second detection signals being not overlap with that of the other, and detection sensitivity of the phase difference becoming maximum at the maximum sensitivity phase difference;
a detection signal selector configured to select one of the first and second detection signals whose predetermined range around the maximum sensitivity phase difference covers a preset phase difference; and
a phase controller configured to control an amount of phase-adjusting by at least one of the two phase adjusters based on a difference between the phase difference detected within the predetermined range using the selected detection signal and the preset phase difference.

2. The phase adjustment device according to claim 1,
wherein the detection signal generator comprises:
a first branch unit configured to branch one of the two signals into first and second branch signals;
a second branch unit configured to branch the other of the two signals into third and fourth branch signals;
a first delayer configured to generate a first delayed signal obtained by delaying a phase of the first branch signal;
a second delayer configured to generate a second delayed signal obtained by delaying a phase of the third branch signal;
a first mixer configured to generate a first synthesized signal obtained by synthesizing the first delayed signal and the fourth branch signal;
a second mixer configured to generate a second synthesized signal obtained by synthesizing the second delayed signal and the second branch signal;
an adder configured to add the first synthesized signal and the second synthesized signal so as to generate the first detection signal; and
a subtractor configured to subtract the second synthesized signal from the first synthesized signal so as to generate the second detection signal.

3. The phase adjustment device according to claim 2, wherein the first detection signal is in proportion to $\cos\theta \cdot \cos\phi$ and the second detection signal is in proportion to $\sin\theta \cdot \cos\phi$, when it is assumed that $\phi$ is an amount of phase-delaying by the first delayer and the second delayer, and $\theta$ is the phase difference detected by using the first and second detection signals.

4. The phase adjustment device according to claim 2, wherein the amount of phase-delaying by the first delayer and the second delayer is set to any other value than $\pi/2 \cdot n$, and wherein n is zero or an integer.

5. The phase adjustment device according to claim 2, wherein the amount of phase-delaying by the first delayer and the second delayer is set to $\pi \cdot (1/4+n/2)$, wherein n is zero or an integer.

6. The phase adjustment device according to claim 1, wherein the maximum sensitivity phase difference of the first detection signal is $\pm\pi/2$, and the maximum sensitivity phase difference of the second detection signal is zero or $\pi$.

7. The phase adjustment device according to claim 2,
wherein the amount of phase-delaying by the first and second delayers is variable, and
wherein the detection signal generator further comprises a delay amount controller configured to control the amount of phase-delaying by the first and second delayers based on the preset phase difference so as to maximize an amplitude of the first detection signal or an amplitude of the second detection signal.

8. The phase adjustment device according to claim 2, wherein the detection signal generator further comprises:
a first differential signal converter configured to convert the fourth branch signal into a first differential signal; and
a second differential signal converter configured to convert the second branch signal into a second differential signal, and
wherein the first mixer is configured to generate the first synthesized signal obtained by synthesizing the first delayed signal and the fourth branch signal converted into the first differential signal, and
wherein the second mixer is configured to generate the second synthesized signal obtained by synthesizing the second delayed signal and the second branch signal converted into the second differential signal.

9. The phase adjustment device according to claim 2, wherein the detection signal generator further comprises:
a third differential signal converter configured to convert one of the two signals into a third differential signal; and
a fourth differential signal converter configured to convert the other of the two signals into a fourth differential signal,
wherein the first branch unit branches the third differential signal into the first and second branch signals,
wherein the second branch unit branches the fourth differential signal into the third and fourth branch signals,
wherein the first delayer is configured to generate the first delayed signal obtained by delaying the phase of the first branch signal as a differential signal,
wherein the second delayer is configured to generate the second delayed signal obtained by delaying the phase of the third branch signal as a differential signal,
wherein the first mixer is configured to generate the first synthesizing signal obtained by synthesizing the first delayed signal as the differential signal and the fourth branch signal, and
wherein the second mixer is configured to generate the second synthesized signal obtained by synthesizing the second delayed signal as the differential signal and the second branch signal.

10. A phase-adjusting method comprising:
generating a pair of first and second detection signals for detecting a phase difference between two signal whose phases have been adjusted by two phase adjusters, respectively, a maximum sensitivity phase difference of one of the detection signals being not overlap with that of the other, and detection sensitivity of the phase difference becoming maximum at the maximum sensitivity phase difference;
selecting one of the first and second detection signals whose predetermined range around the maximum sensitivity phase difference covers a preset phase difference; and
controlling an amount of phase-adjusting by at least one of the two phase adjusters based on a difference between the phase difference detected within the predetermined range using the selected detection signal and the preset phase difference.

* * * * *